United States Patent
Melanson

(10) Patent No.: US 7,423,567 B2
(45) Date of Patent: Sep. 9, 2008

(54) ANALOG-TO-DIGITAL CONVERTER (ADC) HAVING A REDUCED NUMBER OF QUANTIZER OUTPUT LEVELS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/531,144

(22) Filed: Sep. 12, 2006

(65) Prior Publication Data

US 2008/0062026 A1    Mar. 13, 2008

(51) Int. Cl.
H03M 3/00 (2006.01)
H03M 1/12 (2006.01)
(52) U.S. Cl. .................. 341/143; 341/155
(58) Field of Classification Search ........ 341/143, 341/155, 145, 172
See application file for complete search history.

(56) References Cited

U.S. PATENT DOCUMENTS

| | | | | |
|---|---|---|---|---|
| 4,099,122 | A * | 7/1978 | van Buul .................. | 375/249 |
| 5,347,279 | A | 9/1994 | Ishihara et al. | |
| 5,357,252 | A * | 10/1994 | Ledzius et al. ............. | 341/143 |
| 5,471,209 | A * | 11/1995 | Sutterlin et al. ............ | 341/143 |
| 5,959,562 | A * | 9/1999 | Wiesbauer ................ | 341/143 |
| 5,977,899 | A * | 11/1999 | Adams ..................... | 341/145 |
| 5,982,316 | A * | 11/1999 | Shin ........................ | 341/143 |
| 6,201,835 | B1 * | 3/2001 | Wang ....................... | 375/247 |
| 6,473,019 | B1 * | 10/2002 | Ruha et al. ................ | 341/143 |
| 6,608,581 | B1 * | 8/2003 | Semenov .................. | 341/155 |
| 6,873,276 | B2 | 8/2003 | Yang et al. | |
| 6,670,902 | B1 | 12/2003 | Melanson et al. | |
| 6,674,381 | B1 * | 1/2004 | Gomez et al. ............. | 341/143 |
| 6,744,392 | B2 * | 6/2004 | Melanson ................. | 341/143 |
| 6,819,723 | B1 * | 11/2004 | Wu et al. .................. | 375/324 |
| 6,956,514 | B1 | 10/2005 | Melanson et al. | |
| 2002/0021238 | A1 * | 2/2002 | Noro et al. ................ | 341/143 |
| 2004/0021594 | A1 * | 2/2004 | Melanson ................. | 341/143 |
| 2004/0032355 | A1 * | 2/2004 | Melanson ................. | 341/143 |
| 2004/0036634 | A1 * | 2/2004 | Level et al. ................ | 341/77 |
| 2005/0012649 | A1 * | 1/2005 | Adams et al. ............. | 341/143 |
| 2005/0184895 | A1 * | 8/2005 | Petersen et al. ........... | 341/143 |
| 2006/0022855 | A1 | 2/2006 | Motz et al. | |

OTHER PUBLICATIONS

U.S. Appl. No. 11/531,159, filed Sep. 12, 2006, Melanson.
U.S. Appl. No. 11/388,397, filed Mar. 24, 2006, Melanson.

* cited by examiner

Primary Examiner—Jean B Jeanglaude
(74) Attorney, Agent, or Firm—Andrew M. Harris; Mitch Harris, LLC

(57) ABSTRACT

An analog-to-digital converter (ADC) having a reduced number of quantizer output levels provides for reduced complexity and power consumption along with improved linearity. The analog-to-digital converter includes a loop filter, a quantizer for quantizing the output of the loop filter and a digital integrator for integrating the output of the quantizer. A difference circuit is included in the converter that produces a signal proportional to the difference between the present value and a previous value of the digital integrator output and provides feedback to the loop filter. The number of levels of the quantizer output is thereby reduced with respect to the modulator output, since the quantizer is operating on a feedback signal that represents changes in the output of the converter modulator rather than the modulator output itself.

30 Claims, 7 Drawing Sheets

ANALOG-TO-DIGITAL CONVERTER (ADC) HAVING A REDUCED NUMBER OF QUANTIZER OUTPUT LEVELS

BACKGROUND OF THE INVENTION

1. Field of the Invention

The present invention relates generally to analog-to-digital converters, and more specifically, to a analog-to-digital converter having a reduced number of quantizer output levels.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

The delta-sigma modulator based analog-to-digital converter includes a loop filter that receives an input signal and a quantizer that converts the output of the loop filter to a digital representation. Feedback from the quantizer output is applied to the loop filter in feedback modulator topologies or is summed with the output of the loop filter in feed-forward modulator topologies to provide a closed-loop that causes the time-average value of the output of the quantizer to accurately represent the value of the modulator input signal. The loop filter provides shaping of the quantization noise at the output of the quantizer in response to the feedback signal applied from the quantizer to the loop filter. The feedback provided from the quantizer is typically generated by a coarse feedback DAC that receives the digital output of the quantizer and generates an analog value that is provided to the loop filter or the output summer.

Present-day converters typically use multi-bit designs, in that the output of the quantizer is a multi-level signal and the coarse feedback DAC output is therefore also a multi-level signal. The multi-bit implementation provides for improved noise shaping capability and linearity of the converter and generally reduces the linearity and slew-rate requirements of the analog components in the loop filter. Therefore, multi-bit topologies are very desirable, but incur the penalty of a more complex feedback DAC and the consequent increased power consumption. Further, the linearity of the feedback DAC produces a direct effect on the linearity of the converter, as any non-linearity in the feedback DAC will be reflected in the time-average output of the quantizer that represents the input signal. If there is a greater number of bits in the feedback DAC, then it is more difficult to maintain linearity over component and environmental variations. Therefore, the number of levels provided from the quantizer output has a direct impact on ADC performance. The quantizer complexity and power consumption are also functions of the number of bits required to represent the quantizer output.

Therefore, it would be desirable to provide an ADC using a delta-sigma modulator having a reduced number of quantizer output levels.

SUMMARY OF THE INVENTION

The above stated objective of reducing the number of quantizer output levels in a delta-sigma modulator is achieved in an analog-to-digital converter circuit and its method of operation.

The analog-to-digital converter includes a loop filter that provides an output to a quantizer input. The output of the quantizer is provided to a digital integrator that provides the output of a delta-sigma modulator. A difference circuit that generates a difference between a present value and a previous value if the output of the digital integrator provides a feedback signal to the loop filter, which may include a summing circuit for combining the feedback with a plurality of feed-forward signals provided from the loop filter.

The resulting modulator has a reduced number of quantizer output levels for the same loop filter over that of a modulator without the integrator and difference circuit, as the quantizer is quantizing a signal representing only changes in the output of the modulator, rather than the modulator output itself.

The difference circuit may be a digital difference circuit that subtracts a stored previous value of the quantizer output from the present value. The output of the digital difference circuit then is converted by a coarse DAC to an analog value to supply the feedback signal to the loop filter.

Alternatively, the difference circuit may be an analog difference circuit employing a capacitor as a differentiator that receives an analog value of a coarse DAC that has an input coupled to an output of the digital integrator. In another analog implementation, two coarse DACs may be employed, a first DAC having an input coupled to the stored previous value of the digital integrator and a second DAC having an input coupled to the output of the digital integrator. The difference circuit is then provided by an analog subtractor that subtracts the output of the first DAC from the output of the second DAC to generate the feedback signal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for reducing the number of output levels of the quantizer in a delta-sigma modulator based analog-to-digital converter. Reducing the range of values produced by the quantizer reduce the number of bits required from the feedback DAC and quantizer, improving linearity and reducing circuit complexity and power consumption of converters incorporating delta-sigma modulators in accordance with embodiments of the present invention.

The quantizer level reduction of the present invention is performed by a transformation in phase/state space of the output of the modulator with respect to the output of the quantizer. Rather than directly filtering the output of the quantizer to produce the converter result, the quantizer output is integrated in the present invention to produce the modulator output. An additional feedback signal is provided to the loop filter ahead of the quantizer that is transformed to the derivative of the output of the integrator that integrates the quantizer output. The transformation reduces the number of output levels produced by the output of the quantizer, since only changes in the modulator output are present at the quantizer output. Therefore, the complexity of the quantizer can be reduced without compromising noise shaping performance or conversion linearity.

Figure 1:
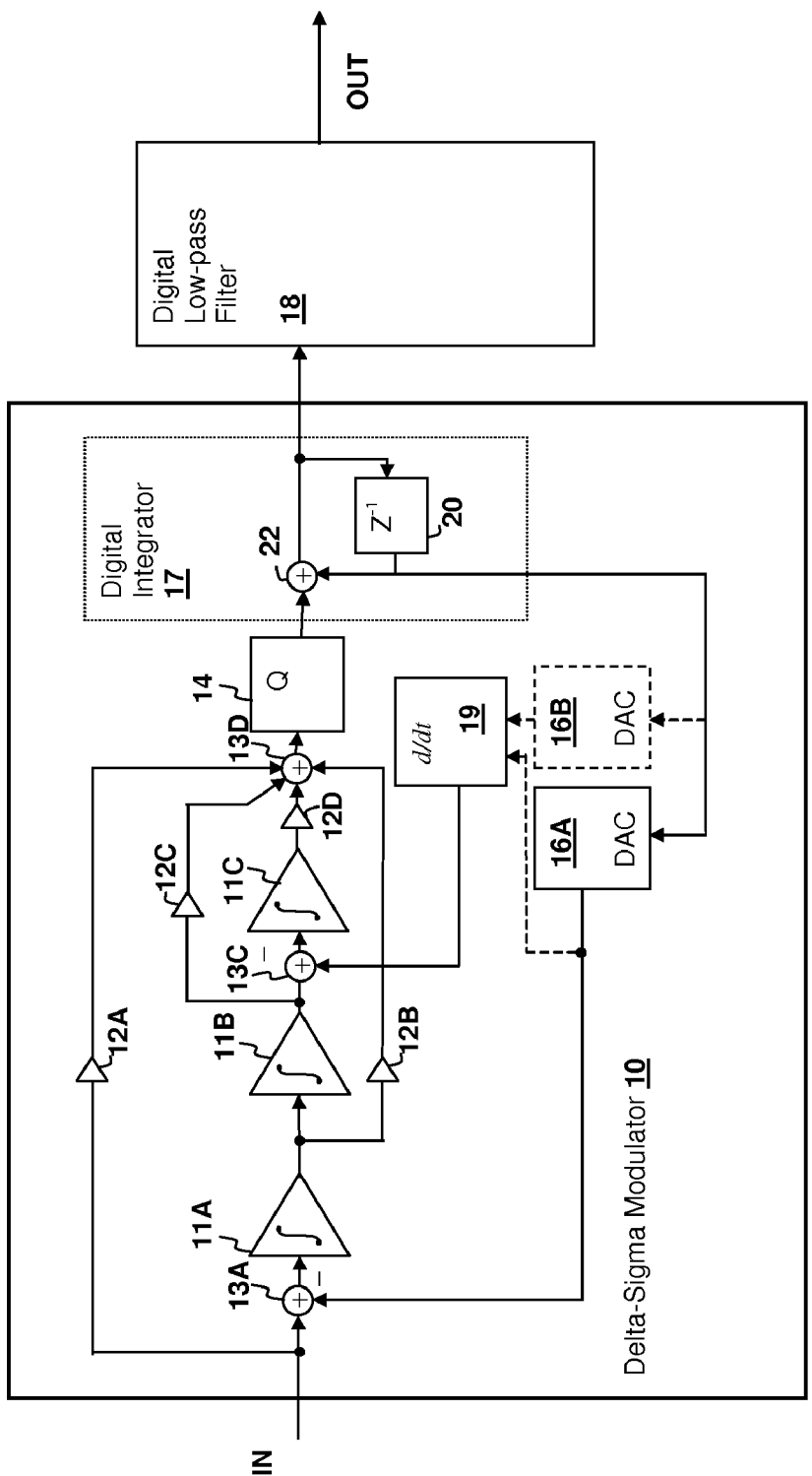
FIG. 1 is a block diagram depicting an ADC topology in accordance with an embodiment of the present invention.

Referring now to FIG. 1, an ADC including a delta-sigma modulator with a topology in accordance with an embodiment of the present invention is shown. A noise shaping delta-sigma modulator 10 has an input IN and provides a noise-shaped output. In the present invention, the output is provided from a digital integrator 17 that integrates the output of a quantizer 14 that quantizes the output of the loop filter. Digital integrator includes a storage device, delay 20 that stores a previous value of the output of digital integrator 17 and an adder 22 that adds the present value of digital integrator 17 to the stored previous value, forming an accumulator. The output of adder 22 is applied to a digital low-pass filter 18, thereby providing a digital output OUT corresponding to the analog input IN. Thus, the depicted circuit forms an analog-to-digital converter (ADC). However, the techniques of the present invention apply to any delta-sigma modulator and to integrating measurement circuits in general.

In order to account for the action of digital integrator 17, a portion of the feedback signal applied to the loop filter is differentiated by a differencing circuit. In the depicted embodiment, the differencing circuit is provided by a differentiator 19 that receives an input from a DAC 16B and applied to a summer 13C that provides the input to the final integrator stage 11C. DAC 16B receives the output of storage device 20. Another feedback path that is necessary for the converter to provide the correct DC and low-frequency output from the converter corresponding to the voltage of signal IN, is provided through another DAC 16A, which also receives the output of storage device 20. In practice, it is possible to differentiate the output of DAC 16A to provide the feedback signal to summer 13C, reducing the number of DACs required to implement the circuit.

In the remainder of the Figure, a loop filter is implemented by a series of analog integrator stages 11A-11C that each receive an input signal from the previous stage. Input summers 13A and 13C provide for combining feedback signals with the other inputs of the first and third integrator stages 11A and 11C, respectively. The output of integrator 11C is combined by a summer 13D with feed-forward signals scaled by scaling circuits 12A-12D, provided from input signal IN and the outputs of integrator stages 11A-C, respectively. The output of summer 13D provides the input to quantizer. The resulting filter is a third-order filter with four tunable feed-forward paths. Combiners 13A and 13C-13D may be a summing amplifiers, and scaling circuits 12A-D may be resistors that set the gain of the summing amplifier with respect to the output of each integrator 11A-11C. Alternatively, for switched-capacitor implementations, scaling circuits 12A-12D will generally be the input charge-transfer capacitors and associated switching circuits.

Figure 2:
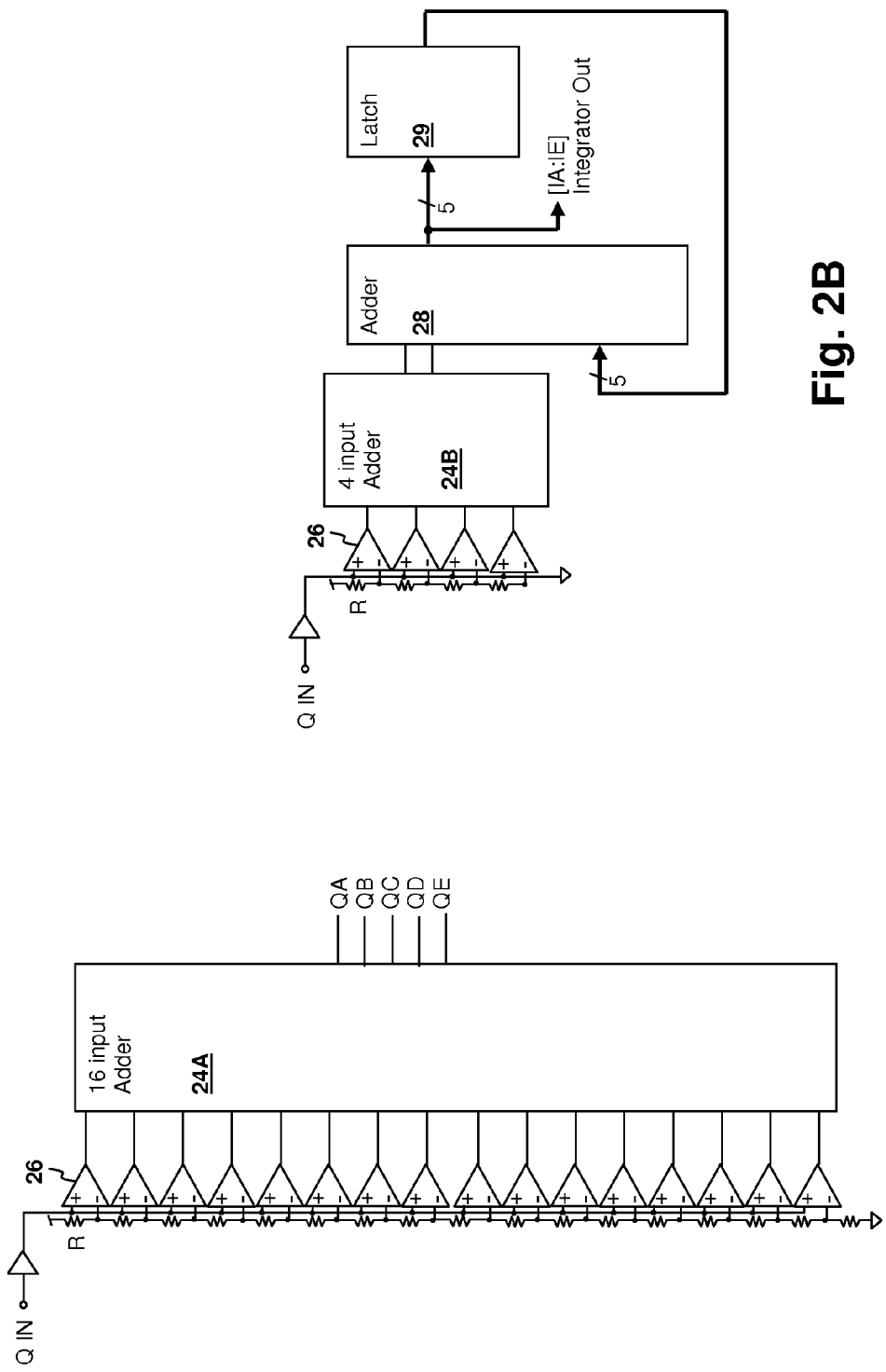
FIG. 2A is a circuit diagram depicting a prior art quantizer.
FIG. 2B is a circuit diagram depicting a quantizer and integrator combination in accordance with an embodiment of the present invention.

Referring now to FIGS. 2A-2B, advantages of delta-sigma modulator topologies in accordance with embodiments of the present invention are illustrated. FIG. 2A depicts a prior art quantizer having a four-bit output and sixteen quantization levels. Sixteen comparators 26 are employed to compare the input signal Q IN to reference voltages provided by a resistive divider string formed by equal resistors R. A 16-bit adder 24A sums the bits provided by comparators 26 to yield a 5-bit number representing the quantized level of quantizer input signal Q IN, which is a value between 0 and 16.

In contrast, the quantizer-integrator combination of the present invention, as depicted in FIG. 2B, requires only four comparators 26 and four resistors R in order to achieve a four-bit resolution at the output of the delta-sigma modulator. An adder 24B having four one-bit inputs adds the outputs of comparators 26 to produce the quantizer output value. Another adder 28 produces a 5-bit digital integrator output value for each quantization cycle, by adding the previous output value of the integrator, which is stored in a 5-bit latch 29 with the output of adder 24B. Thus the present invention can reduce the power required by the quantizer by a factor of approximately four, and since the linearity of the conversion is directly dependent on the linearity of the reference voltage resistor R string, linearity of the conversion can be more easily maintained, due to the need to only match the variation of four resistors rather than sixteen.

Figure 3:
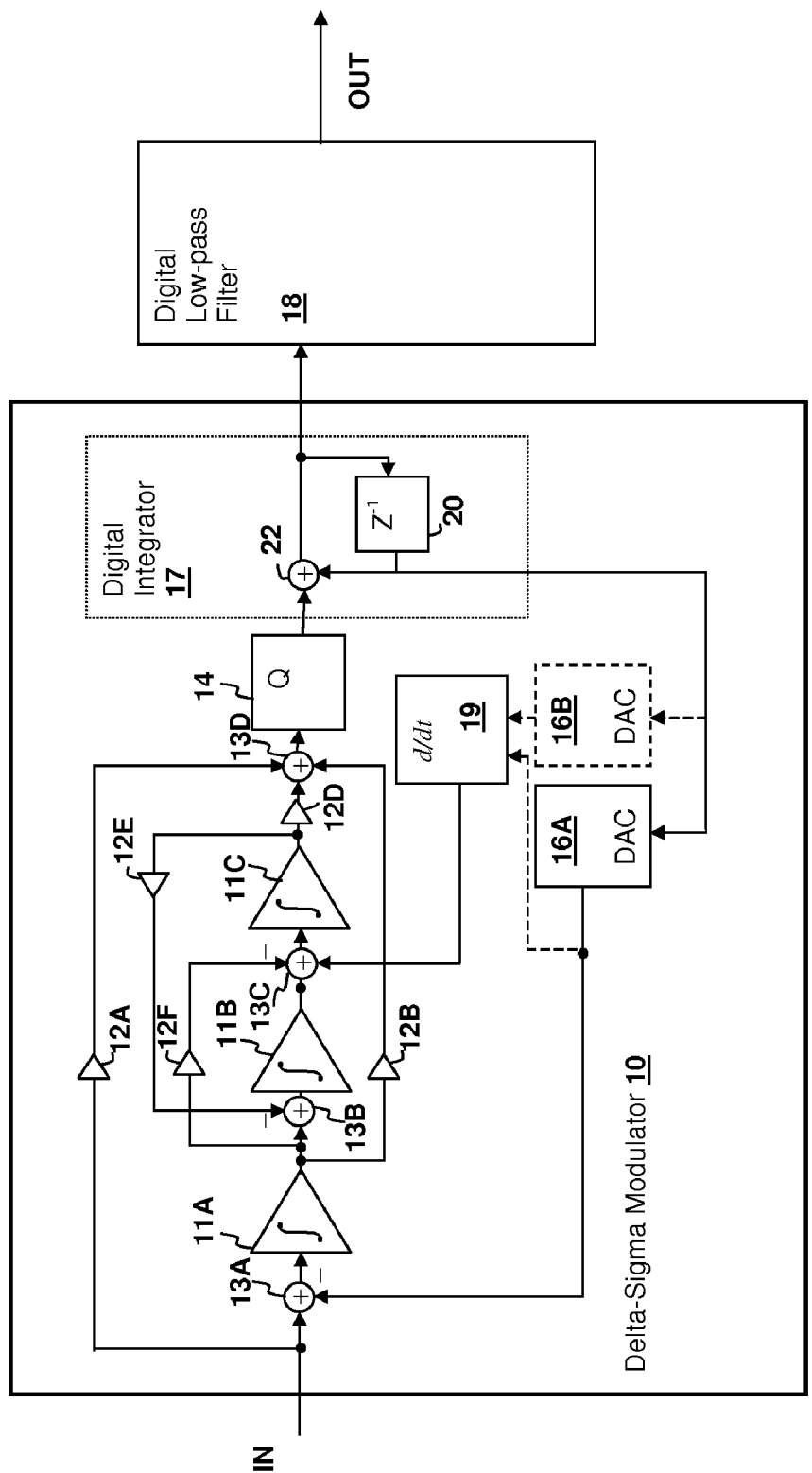
FIG. 3 is a block diagram depicting an ADC topology in accordance with another embodiment of the present invention.

Referring now to FIG. 3, an ADC including a delta-sigma modulator with a topology in accordance with another embodiment of the present invention is shown. The depicted embodiment is similar to that of the ADC of FIG. 1, and therefore only differences between them will be described below. In the embodiment of FIG. 3, the loop filter, implemented by a series of analog integrator stages 11A-11C, has a structure that differs from that of the loop filter included in the embodiment of FIG. 1. The loop filter structure shown in FIG. 3 improves tunability of the filter by including feedback as well as feed-forward paths. The feed-forward path provided from the output of the first integrator stage 11A is applied to the input of the third integrator stage through a scaler 12F and a summer 13C, rather than to summer 13D and scaled by scaler 12C as in FIG. 1. An additional feedback path from the output of third integrator stage 11C is scaled by a scaler 12E and combined in the input of the second integrator stage 11B by summer 13C. The resulting filter is a third-order filter with three tunable feed-forward paths and one tunable feedback path to provide increased degree of noise shaping flexibility over that of a three-stage feed-forward design without the additional feedback path. Combiners 13A-13D may be summing amplifiers, and scaling circuits 12A-B and 12D-F may be resistors that set the gain of the summing amplifier with respect to the output of each integrator 11. Alternatively, for switched-capacitor implementations, scaling circuits 12A-B and 12D-F will generally be the input charge-transfer capacitors and associated switching circuits.

Figure 4:
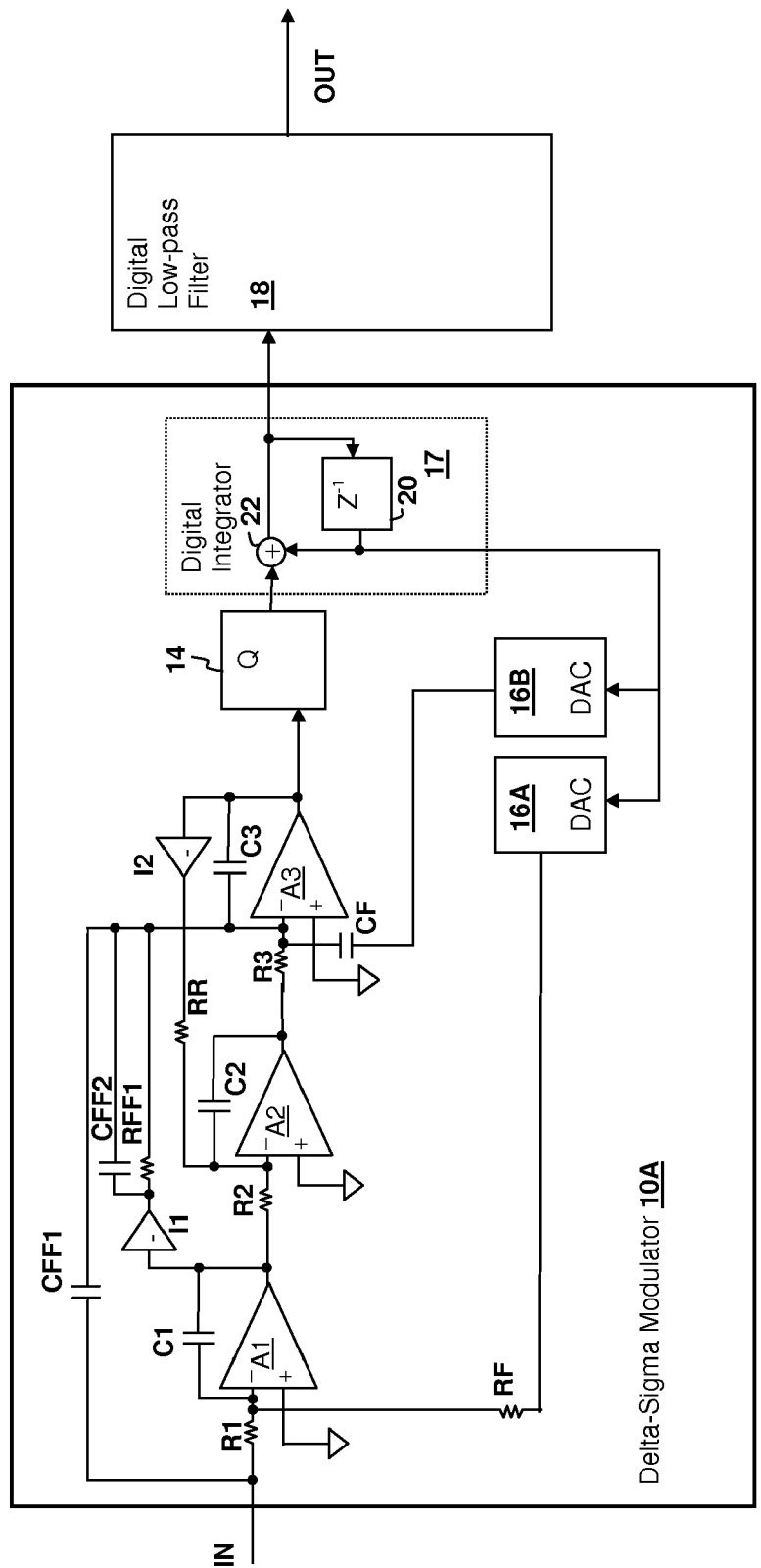
FIG. 4 is a circuit diagram depicting an ADC implementation in accordance with the topology depicted in FIG. 3.

Referring now to FIG. 4, an ADC circuit implementing the delta-sigma modulator topology of FIG. 3 is shown. In the depicted embodiment, the loop filter is implemented as a continuous-time analog circuit, but it is contemplated that equivalent switched-capacitor discrete time circuits can be employed, as well. The depicted circuit is also shown as single-ended for clarity of illustration, but generally will be implemented with fully-differential stages to reduce the need for additional signal inverters in the feed-forward and feedback paths. Integrator stages 11A-11C of FIG. 3 are provided by integrators implemented by amplifiers A1, A2 and A3 along with their corresponding RC networks formed by resistors R1-R3 and capacitors C1-C3. In the depicted embodiment, rather than provide a summer (13D) at the input of quantizer 14, the feed-forward signal paths are referred to the output of the third integrator stage by series capacitors that differentiate the feed-forward signals, effectively canceling the effect of the third integrator stage with respect to their contribution to the loop filter response. Thus, feed-forward capacitor CFF1 provides the feed-forward path corresponding to the path through scaler 12A of FIG. 1 and feed-forward capacitor CFF2 through inverting amplifier I1 provides the feed-forward path corresponding to the path through scaler 12B of FIG. 1. Inverting amplifier I2 and resistor RR provide the feedback path from the output of the third integrator stage to the input of the second integrator stage and resistor RFF1 in combination with inverting amplifier I1 provide the additional feed-forward path through scaler 12C in FIG. 1.

DACS 16A and 16B operate in the same manner as described with respect to FIG. 1, and may also be provided from a single DAC as mentioned above. However, DAC 16B can be simpler than DAC 16A if implemented separately, as while DAC 16A must supply the full multi-bit resolution required by the design and must have a high degree of linearity or be compensated for by techniques such as dynamic element matching (DEM). DAC 16B does not have such requirements and can have a resolution matching that of the output of the quantizer, rather than the integrator. Digital integrator 17 and quantizer 14 also operate as described above with respect to FIGS. 1 and 3. The differencing circuit in the depicted embodiment is provided by a series capacitor CF that couples the output of DAC 16B to the input of the third integrator stage, providing for a shift of a portion of the feedback signal provided from the output of digital integrator 17 as delayed by storage device 20.

Figure 5:
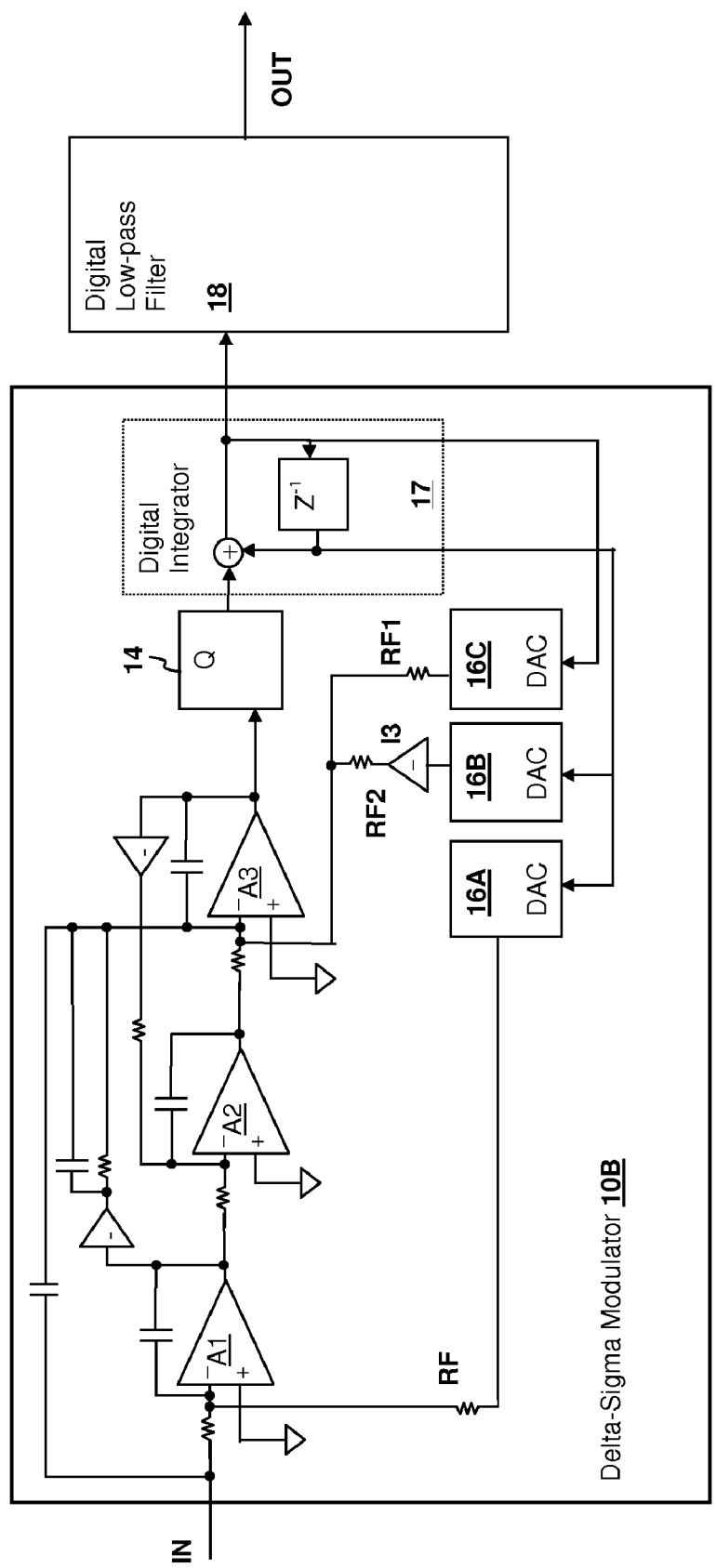
FIG. 5 is a circuit diagram depicting an ADC in accordance with yet another embodiment of the present invention.

Referring now to FIG. 5, another ADC circuit in accordance with an embodiment of the invention is shown. The circuit of FIG. 5 is similar to that of FIG. 4, and therefore only differences between them will be described below. In the depicted embodiment, the differencing circuit is provided by inverting the output of a DAC 16B using an inverting amplifier 13 and summing the inverted output of DAC 16B through resistor RF2 with a signal corresponding to the output of digital integrator 17 provided by another DAC 16C through resistor RF1. Both signals are applied to the input of amplifier A3, which provides the final integrator stage of the loop filter. Therefore, the feedback provided from the differencing circuit is proportional to the difference between the present and the previous value of the output of digital integrator 17. A separate storage device can implement the storage required for the difference circuit if storage 20 is not accessible due to a particular implementation of digital integrator 17 that may differ from the digital integrator shown.

Figure 6:
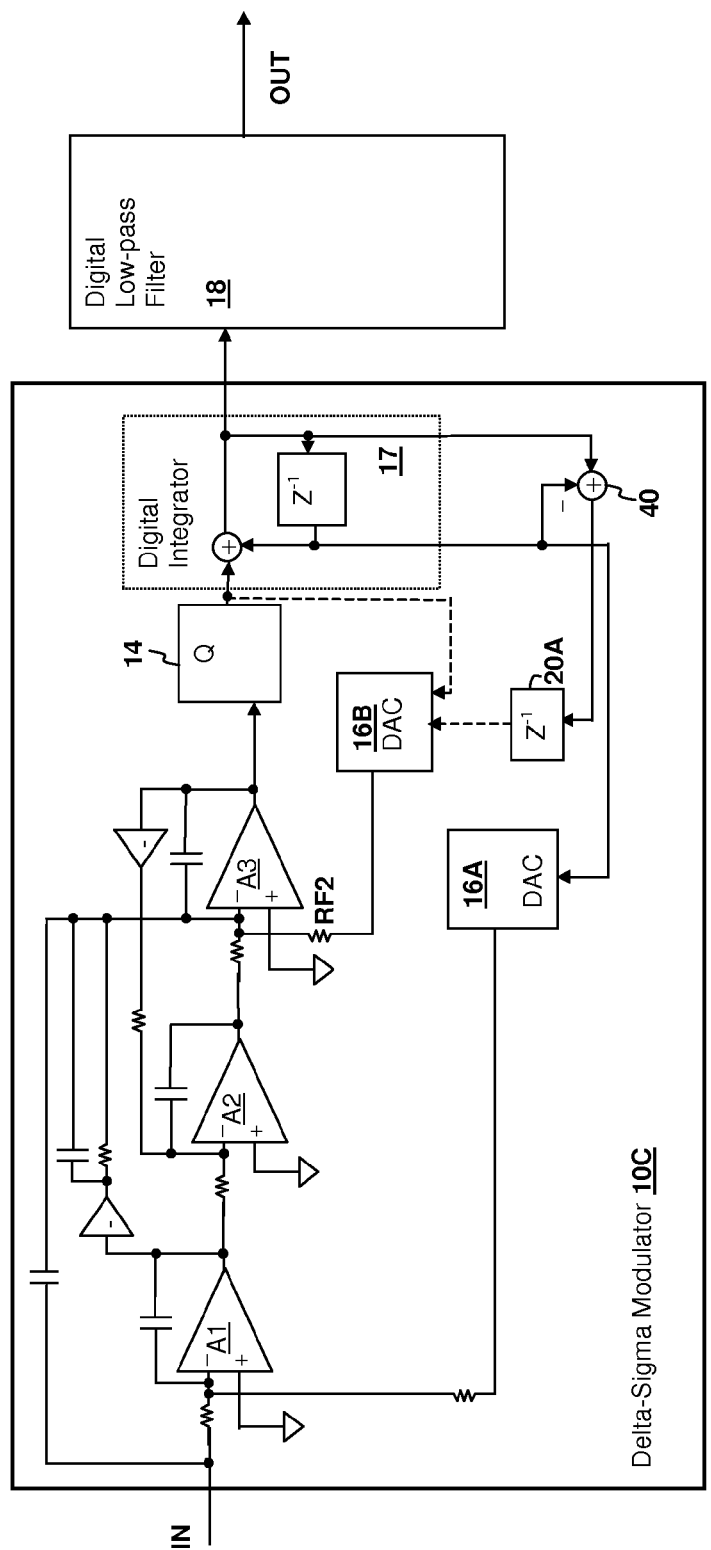
FIG. 6 is a circuit diagram depicting an ADC in accordance with still another embodiment of the present invention.

Referring now to FIG. 6, another ADC circuit in accordance with still another embodiment of the invention is shown. The circuit of FIG. 6 is similar to that of FIGS. 4 and 5, and therefore only differences between them will be described below. In the depicted embodiment, the differencing circuit is provided by a digital subtractor 40 that subtracts the output of storage device 20 from the present value of the output of digital integrator 17. The resulting value is provided to DAC 16B which converts the value to an analog feedback signal that is applied through resistor RF2 to the third integrator stage. Therefore, the feedback provided from the differencing circuit is also proportional to the difference between the present and the previous value of the output of digital integrator 17. A separate storage device can implement the storage required for the difference circuit if storage 20 is not accessible due to a particular implementation of digital integrator 17. However, in actual implementation, subtractor 40 actually computes the output of the quantizer, and therefore, as illustrated by the dashed line, the quantizer output can be provided as feedback to final integrator stage 11C of the loop filter by DAC 16B and resistor RF2.

Figure 7:
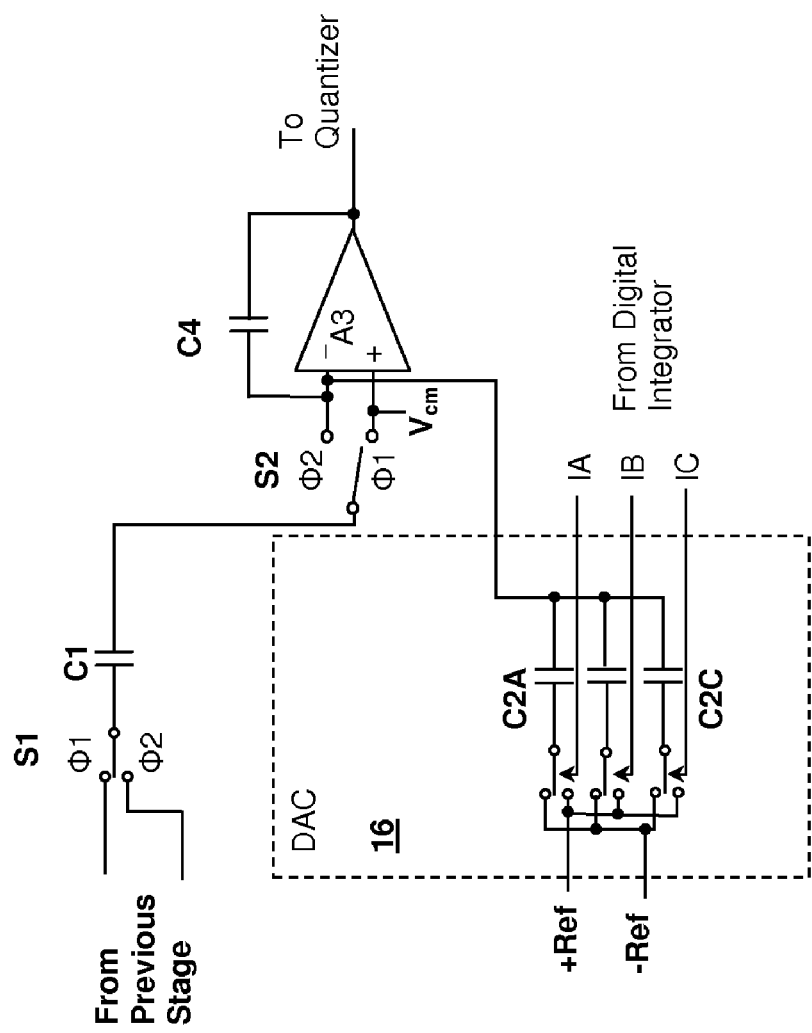
FIG. 7 is a circuit diagram illustrating a discrete-time final integrator stage that may be employed in an ADC in accordance with an embodiment of the present invention.

Referring now to FIG. 7, application of the techniques of the present invention in discrete-time delta-sigma modulator circuits is illustrated in a delta-sigma modulator integrator stage that implements the third integrator stage in a delta-sigma modulator topology such as that depicted in FIG. 1. In the depicted integrator stage, amplifier A3 and capacitor C4 form an integrator in combination with the switched-capacitor stage input network former by switch S1 and switch S2. A feedback signal is supplied from digital to analog converter DAC 16 from a set of selectable capacitors: capacitors C2A-C2C, along with their associated switches, as shown.

DAC 16 operates by using the digital output levels IA-IC of digital integrator 17 to select combinations of capacitors C2A-C2C that form a C2C network according to powers-of-two of the smallest capacitance. The digital values provided to the inputs of DAC 16 from the previous value output of digital integrator 17 select a new combination of capacitors C2A-C2C, previously unselected ones of which were previously charged to the −Ref voltage value and switch to the +Ref voltage value when their corresponding switch changes position. Thus capacitors C2A-C2C act as differentiators coupled in series with the output of a DAC, dumping a charge proportionate to the change in DAC input value only when the input to the DAC changes. Unlike a conventional switched capacitor input, the differentiator input is not switched with a phase of the switched-capacitor clock signal.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. An analog-to-digital converter, comprising:
an analog loop filter of second order or higher order and having an input for receiving an input signal of said analog-to-digital converter;
a quantizer having an input coupled to an output of said loop filter, wherein said quantizer introduces quantization noise by quantizing said output of said loop filter;
a digital integrator having an input coupled to a digital output of said quantizer; and
a multi-bit digital-to-analog converter having an input coupled to an output of the digital integrator, wherein the multi-bit digital-to-analog converter provides a number of analog levels in excess of two as feedback to the analog loop filter corresponding to a first feedback signal path, whereby said loop filter frequency-shapes said quantization noise to move said quantization noise to a frequency band outside of a frequency band of said input signal of said analog-to-digital converter.

2. The analog-to-digital converter of claim 1, further comprising a second feedback signal path for providing a second feedback signal to said analog loop filter that is proportional to a difference between a present value and a previous value of said output of said digital integrator, whereby a number of levels produced at said output of said quantizer is less than a number of levels produced at said output of said digital integrator.

3. The analog-to-digital converter of claim 2, wherein said analog loop filter comprises a plurality of cascaded integrator stages, and wherein said second feedback signal is applied to an input of a final one of said plurality of cascaded integrator stages.

4. The analog-to-digital converter of claim 3, wherein said first feedback path is coupled to an input of a first one of said plurality of cascaded integrator stages.

5. The analog-to-digital converter of claim 3, wherein said second feedback signal path comprises a digital-to-analog converter having an input coupled to said output of said quantizer and an output coupled to said input of said final one of said plurality of cascaded integrator stages.

6. The analog-to-digital converter of claim 1, wherein said second feedback signal path comprises a difference circuit having an input coupled to said output of said digital integrator for generating a signal proportional to a difference between a present value and a previous value of said output of said digital integrator, wherein an output of said difference circuit is coupled to an input of a final one of said plurality of cascaded integrator stages, whereby a number of levels produced at said output of said quantizer is less than a number of levels produced at said output of said digital integrator.

7. The analog-to-digital converter of claim 6, wherein said difference circuit is a hybrid circuit having digital and analog circuit blocks.

8. The analog-to-digital converter of claim 7, wherein said difference circuit comprises:
   a digital-to-analog converter having an input coupled to said output of said digital integrator; and
   a capacitor for coupling an output of said digital-to-analog converter to said input of said final integrator stage.

9. The analog-to-digital converter of claim 7, wherein said difference circuit comprises:
   a first digital-to-analog converter having an input coupled to said output of said digital integrator;
   a storage device for storing said previous value of said output of said digital integrator;
   a second digital-to-analog converter having an input coupled to said output of said storage device; and
   a subtractor having a first input coupled to an output of said first digital-to-analog converter, a second input coupled to an output of said second digital-to-analog converter and an output coupled to said input of said final integrator stage.

10. The analog-to-digital converter of claim 9, wherein said storage device forms part of said digital integrator, and wherein said digital integrator further includes an adder having a first input coupled to said output of said storage device and a second input coupled to an output of said quantizer for providing an output value corresponding to an integral of said output of said quantizer.

11. The analog-to-digital converter of claim 6, wherein said difference circuit is a digital circuit, and further comprising a digital-to-analog converter having an input coupled to an output of said difference circuit and an output coupled to said input of said final integrator stage.

12. The analog-to-digital converter of claim 11, wherein said difference circuit comprises:
   a storage device for storing said previous value of said output of said digital integrator; and
   a digital subtractor having a first input coupled to an output of said digital integrator, a second input coupled to an output of said storage device, and an output coupled to said input of said digital-to-digital converter.

13. The analog-to-digital converter of claim 12, wherein said storage device forms part of said digital integrator, and wherein said digital integrator further includes an adder having a first input coupled to said output of said storage device and a second input coupled to an output of said quantizer for providing an output value corresponding to an integral of said output of said quantizer.

14. The analog-to-digital converter of claim 1, wherein said digital integrator comprises:
   a storage device having an input coupled to said output of said quantizer for storing said previous value of said output of said quantizer; and
   an adder having a first input coupled to said output of said storage device and a second input coupled to an output of said quantizer for providing an output value corresponding to an integral of said output of said quantizer.

15. The analog-to-digital converter of claim 1, wherein said loop filter is a switched-capacitor filter, wherein said difference circuit is provided by a selectable capacitance selected in conformity with an output of said digital integrator, and wherein said selectable capacitance is not interrupted by a clock of said switched-capacitor filter.

16. A method of operating an analog-to-digital converter, comprising:
   filtering an input and feedback signals with an analog loop filter of second order or higher order;
   quantizing a result of said filtering to provide an output signal, wherein said quantizing introduces quantization noise to said output signal;
   integrating a result of said quantizing with a digital integrator;
   converting a digital result of the integrating to an analog signal having a number of levels greater than two;
   providing the analog signal as a first feedback signal to said filtering, whereby said loop filter frequency-shapes said quantization noise to move said quantization noise to a frequency band outside of a frequency band of said input signal of said analog-to-digital converter.

17. The method of claim 16, further comprising providing a second feedback signal proportional to a difference between a previous result and a present result of said integrating to said analog loop filter, whereby a number of levels produced by said quantizing is less than a number of levels produced by said integrating.

18. The method of claim 17, wherein said loop filter is formed by a plurality of cascaded integrator stages, and wherein said providing a second feedback signal provides said second feedback signal to an input of a final one of said plurality of cascaded integrator stages.

19. The method of claim 18, wherein said providing a second feedback signal comprises providing a result of said quantizing to said final integrator of said plurality of cascaded integrator stages.

20. The method of claim 19, wherein said providing second feedback further comprises:
   converting said present result to an analog signal; and
   coupling said analog signal to a final one of said plurality of integrator stages.

21. The method of claim 19, wherein said providing a second feedback signal further comprises:
   converting an output of said digital integrator to a first analog signal;
   storing said previous result;
   converting said previous result to a second analog signal;

subtracting said second analog signal from said first analog signal; and providing a result of said subtracting to a final one of said plurality of integrator stages.

22. The method of claim 19, wherein said providing a second feedback signal further comprises:

storing said previous result as a digital number;

digitally subtracting said previous result from said present result;

converting a result of said digitally subtracting to an analog signal; and providing said analog signal to a final one of said plurality of integrator stages.

23. The method of claim 16, wherein said integrating is performed by adding said previous result to said present result and accumulating a result of said adding.

24. The method of claim 16, wherein said loop filter is a switched-capacitor filter, and wherein said providing second feedback further comprises selecting a capacitance in conformity with a result of said integrating, and wherein said selected capacitance is not interrupted by a clock of said switched-capacitor filter.

25. An analog-to-digital converter, comprising:

an analog loop filter of second order or higher order;

a quantizer having an input coupled to an output of a final one of said plurality of cascaded integrator stages, wherein said quantizer introduces quantization noise at an output of said quantizer;

means for providing an output of said analog-to-digital converter according to an integral of an output of said quantizer;

means for providing a first feedback signal to said loop filter from said quantizer as an analog signal having a number of levels greater than two, wherein an average value of said output of said analog-to-digital converter represents an input signal provided to said loop filter, whereby said loop filter frequency-shapes said quantization noise to move said quantization noise to a frequency band outside of a frequency band of said input signal of said analog-to-digital converter.

26. The analog-to-digital converter of claim 25, further comprising means for providing a second feedback signal to said analog loop filter, whereby a number of levels produced at said output of said quantizer is less than a number of levels produced at said output of said digital integrator.

27. The analog-to-digital converter of claim 25, wherein said means for providing an output of said analog-to-digital converter is a digital integrator.

28. The analog-to-digital converter of claim 27, wherein said means for providing a second feedback signal provides a feedback signal proportional to a derivative of said output of said digital integrator with respect to time.

29. The analog-to-digital converter of claim 25, wherein said means for providing a second feedback signal includes a series capacitance coupled to said analog loop filter.

30. The analog-to-digital converter of claim 29, wherein said means for providing a second feedback signal includes means for generating an analog signal proportional to a derivative of said output of said digital integrator with respect to time and wherein said series capacitance is a capacitor having a first terminal connected to an output of said means for generating and having a second terminal connected to a final integrator stage of said analog loop filter.

* * * * *